United States Patent [19]

Faust

[11] 4,296,196
[45] Oct. 20, 1981

[54] PHOTOPOLYMERIZABLE MIXTURE IN A TRANSFER ELEMENT

[75] Inventor: Raimund J. Faust, Wiesbaden, Fed. Rep. of Germany

[73] Assignee: Hoechst Aktiengesellschaft, Fed. Rep. of Germany

[21] Appl. No.: 163,597

[22] Filed: Jun. 27, 1980

Related U.S. Application Data

[62] Division of Ser. No. 41,741, May 23, 1979, Pat. No. 4,250,248.

[51] Int. Cl.$^3$ .......................... G03C 5/00; G03C 1/68
[52] U.S. Cl. .................................... 430/271; 430/273; 430/284; 430/288; 430/905
[58] Field of Search ...................... 204/159.18, 159.14, 204/159.16, 159.19; 430/271, 273, 284, 288, 905

[56] References Cited

U.S. PATENT DOCUMENTS

| | | | |
|---|---|---|---|
| 3,469,982 | 9/1969 | Celeste | 96/35.1 |
| 3,526,504 | 9/1970 | Celeste | 96/35.1 |
| 3,782,961 | 1/1974 | Takahshi et al. | 204/159.14 |
| 3,850,770 | 11/1974 | Jana et al. | 96/115 P |
| 3,862,920 | 1/1975 | Foster et al. | 260/42.52 |
| 3,907,574 | 9/1975 | Yonezana et al. | 96/115 R |
| 4,019,972 | 4/1977 | Faust | 204/159.15 |
| 4,078,015 | 3/1978 | Leitheiser | 260/77.5 CR |
| 4,088,498 | 5/1978 | Faust | 204/159.15 |
| 4,116,786 | 9/1978 | Hodakowski | 204/159.16 |
| 4,139,436 | 2/1979 | Jasani | 204/159.19 |

FOREIGN PATENT DOCUMENTS 1441108 6/1976 United Kingdom .

Primary Examiner—Jack P. Brammer
Attorney, Agent, or Firm—James E. Bryan

[57] ABSTRACT

This invention relates to a light-sensitive transfer material, comprising a flexible temporary support and a thermoplastic photopolymerizable layer which layer comprises a polymeric, thermoplastic binder which is soluble or at least swellable in aqueous-alkaline solutions, a polyurethane with two terminal acrylic acid or methacrylic acid ester groups which is capable of addition polymerization, and a photoinitiator, the polyurethane corresponding to Formula I

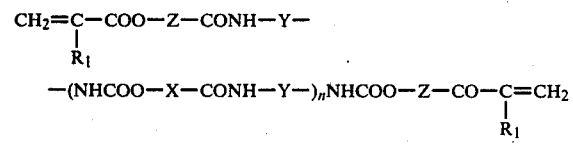

wherein
—X— is one of the groups

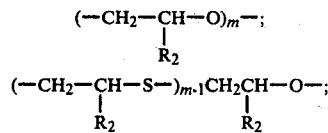

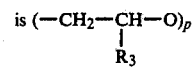

—$C_kH_{2k}$—O— and —$C_rH_{2r-2}$—O—
Y is a saturated aliphatic or cycloaliphatic group with 2 to 12 carbon atoms, and
Z is $(-CH_2-CH-O)_p$
           |
           $R_3$ and wherein
$R_1$, $R_2$ and $R_3$ are hydrogen atoms or methyl groups,
n is a whole number from 2 to 15,
m is a whole number from 2 to 4,
p is a whole number from 1 to 4,
k is a whole number from 2 to 12, and
r is a whole number from 4 to 12.

12 Claims, No Drawings

PHOTOPOLYMERIZABLE MIXTURE IN A TRANSFER ELEMENT

This is a division of application Ser. No. 41,741, filed May 23, 1979, now U.S. Pat. No. 4,250,248.

The present invention relates to a photopolymerizable mixture comprising polymeric binders, polymerizable compounds, and photoinitiators.

Mixtures of this type are used in the reproduction field for the manufacture of printing plates, photoresists, i.e. etching and electroplating resists, and relief images which may be colored.

A particular group of such mixtures adapted for the production of photoresists is used in the form of a dry, photopolymerizable layer on a temporary support consisting of a transparent, flexible plastic film. Under the influence of pressure and heat, the layer is laminated to a metal support which is to be imagewise modified, e.g. a copper plate, and is then exposed and developed to form the photoresist. Preferably, the layers are capable of being developed with aqueous, usually aqueous alkaline developer solutions. Materials of this type and methods of processing them are disclosed, e.g., in U.S. Pat. Nos. 3,469,982, 3,526,504, 4,088,498, and 4,019,972.

If they are developed with aqueous alkaline solutions, the layers disclosed in the above-mentioned patents have an especially good adhesion to the support, in particular copper supports, and a good resistance to etching solutions and electroplating baths.

The binders required for these materials, which must be soluble or at least swellable in aqueous alkaline solutions, frequently have the drawback that they impart a certain brittleness to the exposed layer. This is particularly true in the case of binders containing monomer units which impart to the polymer a higher glass transition temperature and which are thus preferred because they prevent a cold flow of the unexposed layer. Binders of this type are disclosed, e.g., in U.S. Pat. No. 3,930,865.

Monomers containing more than two polymerizable groups in the molecule, which otherwise are particularly advantageous because their exposure products have a high cross-linking density, normally also yield relatively brittle exposure products, especially if exposure is prolonged beyond the optimum exposure time.

Certain compounds containing urethane groups in their molecules have proved particularly suitable as monomeric or polymerizable compounds which are readily compatible with the above-mentioned binders and possess other properties which are of advantage for photoresist techniques. Polymerizable compounds of this type are disclosed in the above-mentioned German Offenlegungsschriften. Due to their higher number of acrylic ester groups or their relatively low molecular weight, the compounds disclosed in U.S. Pat. No. 4,088,498, which invariably contain two urethane groups in their molecules, produce a high cross-linking density and thus layers which tend to be brittle after exposure. Higher molecular weight compounds of this type produce layers which tend to have a lower light-sensitivity and lower resistance to developer solutions.

The compounds containing biuret groups, which are disclosed in U.S. Pat. No. 4,019,972, also have a tendency towards forming relatively brittle exposure products. The compounds with four urethane groups and one polyester group in the molecule, which are also described in this patent, still have a certain resemblance to the compounds containing two urethane groups.

Generally, it can be stated that photopolymerizable layers which have a satisfactorily low degree of cold flow in the unexposed state and which, after exposure, show good adhesion to metal supports, good resistance to developer solutions, and good resistance to etching solutions and electroplating baths, form relatively brittle exposure products. Because this applies particularly to over-exposures, usually there is only a very narrow exposure latitude for processing such layers, if optimum combinations of properties are to be achieved. A further embrittlement may occur during storage or handling of the products at daylight.

This increased brittleness of the exposed and even of the unexposed photoresist layers may cause considerable difficulties in the further processing of these layers, e.g. in the production of printed circuits. One of these difficulties is that the brittle resist layer tends to form flakes when the copper circuit boards laminated to the dry resist are cut, thus leading to serious contamination and interference with the further processing of the material. As another drawback, the brittle resist overhangs tend to break off during etching in conventional spray etching apparatuses, or fine details of the photomasks crack off in aggressive electroplating baths, especially in gold baths in which the current yield is relatively low (e.g. from 45 percent down to 25 percent). In this case, hydrogen is formed which may easily cause a cracking of brittle resist masks.

U.S. Pat. No. 3,782,961, discloses higher molecular weight polyurethane compounds which are capable of polymerization and contain polyether blocks with at least 5, preferably 9 or 10 ether bonds in the molecule, but they are used in the patent for other purposes, namely for the production of flexographic printing plates. The compounds are not described in combination with high-polymeric binders. If they are combined with high-polymeric binders to form solid light-sensitive layers, the layers have a tendency towards cold flow if enough polymerizable compound is added to guarantee satisfactory cross-linking. Furthermore, exposed layers of this type have the drawback that up to a distance of about 50 μm and more from the resist lines, the deposition of copper from acid electroplating baths is hindered, so that no copper is deposited in the fine lines of a wiring diagram. This type of polymerizable polyurethanes is thus unsuitable for the manufacture of photoresists.

U.S. Pat. No. 3,850,770, discloses monomeric urethane compounds which, in combination with alkali-soluble binders yield flexible photopolymerizable layers which may be used for the production of printing plates. These urethanes also contain polyether sequences, preferably those containing from 8 to 10 ether bonds. The compounds contain four urethane groups each, and it is stated in the U.S. patent that an excessive urethane group content per molecular weight unit renders the compounds unsuitable for the intended purpose.

It is the object of the present invention to provide new urethane group-containing photopolymerizable compounds which may be combined with binders that are soluble or swellable in aqueous alkalies to form photopolymerizable layers which have only an insignificant cold flow, or no cold flow at all, and produce exposure products with a high cross-linking density and thus, a high resistance to developer solutions, etching solutions, or electroplating baths, and good adhesion to metal supports, especially copper supports, and which are still flexible even if they are substantially overexposed, and have all the other characteristics required for the manufacture of photoresists.

The invention is based on a photopolymerizable mixture which comprises a polymeric binder that is soluble or at least swellable in aqueous alkaline solutions; a photoinitiator; and a polyurethane with two acrylic or methacrylic acid ester groups in the molecule which is capable of addition polymerization.

The mixture according to the present invention contains a polyurethane corresponding to Formula I

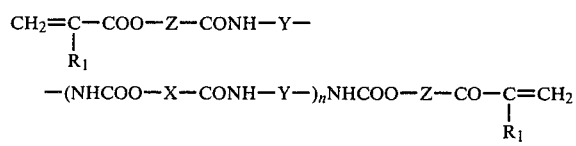

wherein
—X— one of the following groups:

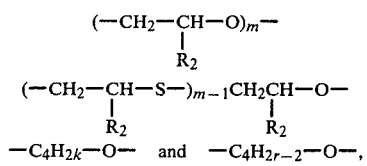

Y is a saturated aliphatic or cycloaliphatic group with 2 to 12 carbon atoms,
Z is the group

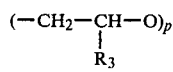

and wherein $R_1$, $R_2$, and $R_3$ are hydrogen atoms or methyl groups,
n is a whole number from 2 to 15,
m is a whole number from 2 to 4,
p is a whole number from 1 to 4,
k is a whole number from 2 to 12, and
r is a whole number from 4 to 12.

The mixture according to the present invention normally contains between 10 and 60 percent by weight, preferably between 15 and 35 percent by weight, calculated on the weight of its non-volatile components, of compounds corresponding to Formula I.

On the average, the compounds according to the invention contain at least 6 urethane groups in their molecules, i.e. at least three urethane groups for each double bond. Their average molecular weights generally range from about 800 to 10,000, and preferably from 1,000 to 7,000. The lower molecular weight compounds should have a viscosity of at least $10^5$ mPa.S; higher molecular weight compounds are solid.

Among the compounds corresponding to Formula I, those are preferred in which n is a whole number between 2 and 11, preferably between 3 and 7. Compounds in which n=2 to 4 are capable of being present in the mixture as the only polymerizable compound. Compounds in which n=5 or more are preferably combined with low molecular weight urethanes. Both the compounds in which n=2 to 4 and also the diurethanes obtained from 1 mole of diisocyanate and 2 moles of hydroxy alkyl methacrylate or -acrylate disclosed in U.S. Pat. No. 4,088,498, and the tetraurethanes obtained from 1 mole of diol or polyether diol, 2 moles of diisocyanate, and 2 moles of hydroxyalkylacrylate or methacrylate, known from U.S. Pat. No. 4,019,972, are suitable for this purpose. Depending upon the molecular weight of the high molecular weight polyurethane, the quantity of low molecular weight urethane may constitute up to 70 percent by weight of the total quantity of polymerizable urethanes; preferably it amounts to 20 to 55 percent by weight.

The compounds corresponding to Formula I may be used in the form of the pure compounds with an exactly defined uniform value for n. In practice, however, they will in most cases be in the form of mixtures of homologous compounds whose molecular weights and values for n will vary around a mean value, depending upon the manner of their preparation which will be described hereinafter. If reference is made in the following to certain values for n or to tetraurethanes, e.g. those mixtures of homologous compounds are always included which have corresponding mean values and which approximately correspond to the value stated. The mean values for n or for the molecular weights may be calculated, with an accuracy which is sufficient for practical purposes, from the quantity of reaction partners used, without exactly ascertaining the molecular weight of the product obtained.

The diol group X in the above general formula I may be derived from a saturated or from a singly unsaturated diol. Suitable saturated diols are linear and branched compounds with 2 to 12 carbon atoms, preferably 4 to 12 carbon atoms.

Examples of suitable diols are: ethylene glycol, propylene glycol, butane-diol-(1,4), but-2-enediol-(1,4), 2-ethyl-hexane-diol-(1,6), decanediol-(1,10), and 1,4-bis-hydroxymethylcyclohexane.

The diol group X may further contain oxygen or sulfur atoms in its chain. Polyglycol groups, especially polyethylene glycol groups with 1 to 3 ether bonds, are preferred. Triethylene glycols are preferably used as the diol component.

The group Y which is derived from the diisocyanate used for the preparation, is a saturated aliphatic or cycloaliphatic group with 2 to 12, preferably 6 to 12 carbon atoms. Acyclic aliphatic diisocyanates are preferred, in particular those with at least one lateral methyl group. 2,2,4-trimethyl-hexamethylenediisocyanate is a particularly advantageous compound.

$R_1$ preferably is a methyl group, $R_2$ and $R_3$ preferably are hydrogen atoms, and p is preferably 1.

As a rule, the novel polymerizable polyurethanes are prepared in two steps. First, the diol component HO—X—OH is reacted with the desired excess of diisocyanate OCN—Y—NCO. If 3 moles of diisocyanate are reacted with 2 moles of diol, an intermediate product with 2 terminal isocyanate groups is obtained which on the average contains 3 diisocyanate units and 2 diol units, i.e. a compound in which n=2. As already mentioned, such reaction products normally do not correspond to the ideal theoretical composition. A gel-chromatographic analysis shows that in most cases mixtures composed of low molecular weight polyurethanes and polyurethanes of considerably higher molecular weight result. Then, the terminal isocyanate groups are caused to react with the hydroxyalkyl acrylate or methacrylate selected. By this process, normally polymer homologous mixtures are produced, i.e. mixtures of compounds in which the value for n varies. This applies particularly to those mixtures in which the mean values of n are relatively high. Such mixtures are excellently suitable for the purposes of the present invention and may be immediately used. If it is desired to obtain products with a more exactly defined or at least less varying molecular weight, it is also possible for the above-mentioned diisocyanate intermediate product to be stepwise prepared, by first reacting 1 mole of diol with 2 moles of diisocyanate, then reacting the reaction product with 2 moles of diol, and so on.

As mentioned above, the mixtures according to the invention may contain, in addition to the polyurethanes mentioned, a certain proportion of known polymerizable diurethanes or tetraurethanes. Reaction products obtained from 1 mole of one of the above-mentioned diisocyanates and 2 moles of hydroxyalkylacrylate, preferably hydroxyalkyl methacrylate, are preferably used as diurethanes, and reaction products obtained from 1 mole of diol, preferably triethylene glycol, 2 moles of the corresponding diisocyanate, and 2 moles of hydroxyalkyl acrylate or hydroxyalkyl methacrylate are preferably used as tetraurethanes. Other acrylic acid esters or methacrylic acid esters containing no urethane groups may be added in small quantities, e.g. up to 10 percent of the quantity of the monomer, but preferably only urethane monomers are used.

The mixtures according to the present invention yield photopolymerizable layers of high light-sensitivity and good flexibility which have only a very slight tendency towards cold flow or no cold flow tendency at all. The exposure products are distinguished by high flexibility and good resistance to aqueous alkaline developer solutions and to etching solutions and electroplating baths. In addition, they have all the advantages of the known mixtures containing alkali-soluble binders and urethane group-containing monomers. It is particularly surprising that, by using the novel urethane monomers, it is not only possible to reduce the cold flow of the unexposed layer but also to improve the flexibility of the exposure products, as compared with layers containing hitherto known urethane monomers. The desired combination of properties which normally are difficult to reconcile with each other is even maintained if the layer is substantially overexposed, so that the consumer is spared the expensive and troublesome task of exactly determining the optimum exposure time for each original and each light source used.

The photopolymerizable mixtures according to the present invention further contain polymeric, preferably thermoplastic, binders which are soluble or at least swellable in aqueous-alkaline solutions. Polymers of this type contain groups which form salts in an alkaline medium, e.g. COOH, PO$_3$H$_2$, SO$_3$NH$_2$, SO$_2$NHCO, or OH groups. Polymers containing carboxyl groups are preferred. Maleic acid resins, polymers of N-(p-toluenesulfonyl)-carbamic acid-($\beta$-methacryloyloxy)-ethyl ester, and copolymers of such monomers, further styrene-maleic acid anhydride-copolymers and in particular, acrylic and methacrylic acid copolymers may be used as binders. The latter compound may contain alkyl acrylates and alkyl methacrylates as comonomers, of which at least some have alkyl groups with 4 to 15 carbon atoms, and, additionally, styrene, substituted styrene, acrylonitrile, benzyl acrylate, or a similar monomer forming a homopolymer with a glass transition temperature Tg of at least 80° C. Such preferred binders are disclosed in U.S. Pat. Nos. 3,804,631 and 3,930,865. The binder should have an average molecular weight of at least 10,000, preferably of about 20,000 to 200,000. Normally, the acid number is between 50 and 250, preferably between 100 and 200. Terpolymers of methacrylic acid, an alkyl-methacrylate with 4 to 12 carbon atoms in the alkyl group, and styrene or substituted styrene are preferred. As a rule, the binder content is in the range from 20 to 80 percent by weight, preferably between 35 and 65 percent by weight of the non-volatile components of the mixture.

Advantageously, the mixtures according to the present invention contain certain plasticizers which, in addition to the effect of the monomers, substantially improve the flexibility of the layers after exposure. These plasticizers which are described in detail in simultaneously filed application Ser. No. 041,742, filed May 23, 1979, now U.S. Pat. No. 4,245,030 are compounds corresponding to the following Formula II;

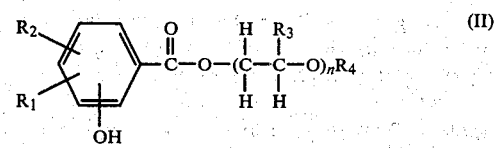

wherein

R$_1$ is a hydrogen or halogen atom or an alkyl group with 1 to 4 carbon atoms,

R$_2$ is a hydrogen atom, an OH group, or an alkyl group with 1 to 4 carbon atoms, R$_3$ is a hydrogen atom or a methyl group, R$_4$ is an alkyl or alkenyl group with 1 to 20 carbon atoms, and n is zero or a whole number from 1 to 20, and wherein R$_4$ has at least 4 carbon atoms if n is zero or 1.

A large number of substances may be used as photoinitiators. Benzoin, benzoin ether, multi-nuclear quinones, e.g. 2-ethyl-anthraquinone, acridine derivatives, e.g. 9-phenyl-acridine, 9-p-methoxyphenyl acridine, 9-acetyl-amino-acridine, or benz(a)acridine, phenazine derivatives, e.g. 9,10-dimethyl-benz(a)phenazine, 9-methyl-benz(a)-phenazine, or 10-methoxy-benz(a)-phenazine, quinoxaline derivatives, e.g. 6,4′,4″-trimethoxy-2,3-diphenylquinoxaline, or 4′,4″-dimethoxy-2,3-diphenyl-5-aza-quinoxaline, quinazoline derivatives, and the like, are exemplary. As a rule, their quantity is in the range of 0.1 to 10 percent of the weight of the non-volatile components of the mixture.

In addition to monomers, plasticizers, photoinitiators and binders, the mixture according to the present invention may include a number of further conventional additives, such as inhibitors to prevent thermal polymerization of the monomers, adhesion-promoting agents, hydrogen donors, sensitometric regulators, dyes, colored or uncolored pigments, color couplers and indicators.

Advantageously, these additives should be selected in a manner such that they do not excessively absorb within the actinic wavelength range essential for the initiating process.

The photopolymerizable mixture according to the present invention may be marketed in known manner as a solution or dispersion, which the consumer uses in particular for the preparation of etch resist layers. Preferably, however, the mixtures according to the invention are used for the preparation of dry resist films which are composed of a ready-made photoresist layer on a temporary support, e.g. a transparent plastic film.

Such dry resist films are laminated by the consumer to the support on which an image is to be formed by etching or electroplating and are then exposed and developed in situ, the temporary support being removed before development.

The mixture according to the present invention is particularly suitable for this type of use. Alternatively, it may be manufactured as a presensitized copying material on a suitable support, e.g. aluminum or zinc, for the photomechanical production of off-set or letterpress printing forms. Moreover it is suitable for the production of relief images, screen printing stencils, color proofing films and the like. The advantages of the present material are effective in all cases where good and lasting flexibility of the exposed layer, low cold flow of the unexposed layer, and high resistance of the exposed layer to aggressive chemicals are of importance.

The light-sensitive materials containing the mixture according to the present invention are prepared in known manner. Thus, a solvent may be added to the mixture and the resulting solution or dispersion may be applied to the support by casting, spraying, immersion, roller application, or some other method, and the resulting film dried. Thicker layers (e.g. of 250 $\mu$m or more) may be prepared, as a self-supporting film, by extrusion or molding and the film is then laminated to the support.

Suitable supports for the copying layers containing the mixtures according to the invention are metals, e.g. aluminum, zinc, copper, steel, chromium, brass, and other metal alloys, further supports for screen printing stencils, e.g. nickel or perlon gauze, and, plastic films, e.g. polyester films, especially surface-treated plastic films.

The copying layers according to the invention are exposed and developed in the conventional manner. Suitable developers are aqueous, preferably aqueous-alkaline solutions, e.g. alkali phosphate or alkali silicate solutions, to which, if desired, small quantities, e.g. up to 10 percent by weight, but preferably less than 5 percent by weight, of water-miscible organic solvents or wetting agents may be added. Development may be effected by manual treatment, or by treatment in commercial spray development or brush development apparatuses.

As already mentioned, the mixtures according to the present invention may be used for very different purposes. As a particularly advantageous application, they are used for the production of photoresist or etch resist layers on metal supports. They are particularly suitable for use on copper supports. In this—preferred—application, the excellent adhesion and flexibility of the exposed areas of the layer are of advantage not only during development, but also during the subsequent etching of the support wherein the layers display good flexibility and etch resistance.

The mixtures may be used and handled with particular advantage in the form of the so-called dry resist materials mentioned above, because even dry layers are capable of being transferred onto metal supports and forming firmly adhering layers thereon. In this case, polyester films may be used with particular advantage as temporary supporting films.

In the following examples, some embodiments of the inventive mixture are described. Unless stated otherwise, percentages and proportions are by weight.

EXAMPLE 1

6.5 g of a terpolymer of n-hexylmethacrylate, methacrylic acid, and styrene (60:30:10) with an average molecular weight of about 35,000, 2.8 g of a polymerizable diurethane obtained by reacting 1 mole of 2,2,4-trimethyl-hexamethylene-diisocyanate with 2 moles of hydroxyethyl methacrylate, 2.8 g of the polymerizable polyurethane described below, 0.2 g of 9-phenyl-acridine, 0.1 g of 3-mercapto-propionic acid-2,4-dichloroanilide, 0.035 g of a blue azo dye, obtained by coupling 2,4-dinitro-6-chloro-benzene diazonium salt with 2-methoxy-5-acetylamino-N-cyanoethyl-N-hydroxyethyl-aniline, and 2.8 g of 4-hydroxy-benzoic acid-(2-ethyl-hexyl)ester, are dissolved in 35.0 g of methylethyl-ketone, and 2.0 g of ethanol and the resulting solution is whirler-coated onto a 25 $\mu$m thick, biaxially stretched and heat-set polyethylene terephthalate film in a manner such that, after drying a 100° C., the layer weighs 28 g/m$^2$.

The resulting dry resist film is laminated by means of a commercial laminating apparatus, at 120° C., to a laminated phenoplast panel provided with a 35 $\mu$m thick copper foil and is then exposed for 8 seconds in a commercial exposure device. The master used is a line original in which the lines and the distances between lines have widths down to 80 $\mu$m.

After exposure, the polyester film is stripped off and the layer is developed within 50 seconds in a 0.8 percent Na$_2$CO$_3$ solution in a spray developing apparatus.

The plate is then rinsed for 30 seconds with tap water, superficially etched for 1 minute with a 25 percent ammonium persulfate solution, and then successively electroplated in the following electrolyte baths:

1. 40 minutes in a copper electrolyte bath marketed by Messrs. Blasberg, Solingen, under the designation "Feinkornkupferplastic-Bad" Current density: 2 A/dm$^2$ Thickness of the metal layer produced: about 20 $\mu$m.

2. 10 minutes in a nickel bath of type "Norma" marketed by Messrs. Blasberg, Solingen. Current density: 4 A/dm$^2$ Thickness of the metal layer produced: 6 $\mu$m, and 3. 15 minutes in a gold bath of type "Autronex N", marketed by Messrs. Blasberg, Solingen. Current density: 0.6 A/dm$^2$ Thickness of the metal layer produced: 2.5 $\mu$m. The plate shows no undercutting or damage.

The plate then may be decoated in a 5 percent KOH solution at 50° C. and the bared copper areas may be etched away by conventional etching means.

Even after 10-times overexposure, i.e. after an exposure time of 80 seconds in the above-described exposure apparatus, the above-described dry resist film is completely flexible. This can be proved by manually stretching an about 2 cm wide and 20 cm long strip of the exposed material composed of support and layer. At room temperature, the 10-times overexposed strip of dry resist film can be stretched to at least twice its original length without cracking or tearing of the layer.

This flexibility is of decisive importance for many processing steps, such as cutting of the laminated material, etching, gold-plating, and others. Furthermore, the above-described dry resist film has a very low cold flow in the unexposed state, so that rolls can be stored for long periods of time without the resist layer squeezing out at the edges.

By means of the above-described layer, lines of a width of 50 μm can be resolved with sharp edges, as can be easily proved by exposure under a resolution test original and development with a 0.8 percent $Na_2CO_3$ solution. The developer resistance corresponds to at least 5-times the developing time.

THE POLYURETHANE USED IN THIS EXAMPLE IS PREPARED AS FOLLOWS 11 moles of 2,2,4-trimethyl-hexamethylene-diisocyanate in 4.5 kg of methylethyl ketone are filled into a three-necked flask provided with a stirrer, a reflux condenser with a $CaCl_2$-drying tube, and a dropping funnel. After adding a mixture of 1.5 g of iron(III) acetylacetonate and
2.0 g of diethyl cyclohexyl amine in
50.0 g of methyl ethyl ketone, which acts as a catalyst, a solution of 10 moles of anhydrous triethyleneglycol in 500 g of methyl ethyl ketone is cautiously added in a manner such that a constant reaction temperature of 70°±1° C. is maintained. For this purpose, a water bath is provided which first has a temperature of 60° C., so that it heats the mixture from the outside, and after the desired interior temperature has been reached by the heat generated by the polyaddition reaction, the same bath—which now has a temperature between about 40° and 50° C.—serves to cool the reaction mixture. When the entire triethyleneglycol solution has been introduced, first 15 g of p-benzoquinone and then 2 moles of hydroxyethyl methacrylate are added at 70° C. After completion of the reaction, the mixture is stirred for 2 hours at 70° C. and then 30 g of hydroquinone monomethyl ether is added and the solution is cooled. The resulting polyurethane may be added to the polymerizable mixtures either in the form of the solution or as a resin, after the solvent has been distilled off. In the examples, the polyurethanes are used in the form of the resins.

EXAMPLE 2

Instead of the unsaturated polyurethane described in Example 1, the same quantity (2.8 g) of a polyurethane may be used which is prepared analogously from 11 moles of 2,2,4-trimethyl-hexamethylene diisocyanate and 10 moles of butene-2-diol-1,4 (first reaction step) and then 2 moles of hydroxyethyl methacrylate (second reaction step).

A dry resist film is prepared in a manner analogous to that described in Example 1. The resist layer has a weight of 34 g/m² and is still stretchable and flexible after a 5-times overexposure. The resistance of the layer to the electroplating baths used in Example 1 is excellent.

EXAMPLE 3

Example 1 is repeated with the exception that the polyurethane is replaced by the same quantity (2.8 g) of a polyurethane which is analogously prepared from 11 moles of 2,2,4-trimethyl-hexamethylene diisocyanate and 10 moles of thio-dipropyleneglycol (first reaction step) and then 2 moles of hydroxyethyl methacrylate (second reaction step).

A dry resist film with a layer weight of 30 g/m² is prepared which, in a test, was found to have the same good qualities as the resist film of Example 1 as regards resistance to electroplating baths and flexibility.

EXAMPLE 4

Example 1 is repeated with the exception that the polyurethane is replaced by the same quantity (2.8 g) of a polyurethane which is analogously prepared from 11 moles of 2,2,4-trimethyl-hexamethylene diisocyanate and a mixture composed of 5 moles of triethylene glycol and 5 moles of thiodiglycol (first reaction step) and 2 moles of hydroxyethyl methacrylate (second reaction step).

EXAMPLE 5

Example 1 is repeated with the exception that the polyurethane is replaced by the same quantity (2.8 g) of a polyurethane which is analogously prepared from 11 moles of 2,2,4-trimethyl-hexamethylene diisocyanate and a mixture composed of 5 moles of decane-diol-(1,10) and 5 moles of triethyleneglycol (first reaction step) and 2 moles of hydroxy ethyl methacrylate (second reaction step).

EXAMPLE 6

6.5 g of the terpolymer used in Example 1,
5.0 g of an unsaturated polyurethane which was prepared analogously to the reaction described in Example 1, from 3 moles of 2,2,4-trimethylhexamethylene diisocyanate and 2 moles of triethylene glycol (first reaction step) and 2 moles of hydroxy ethyl methacrylate (second reaction step),
2.8 g of 4-hydroxy-(2-ethylhexyl)-benzoate,
0.2 g of 9-phenyl-acridine,
0.1 g of 3-mercapto-propionic acid-2,4-dichloroanilide and
0.025 g of the dye "Disperse Red" (Color Index No. 179)

are dissolved in 25.0 g of methyl ethyl ketone and 2.0 g of ethanol, and the resulting solution is whirler-coated, as described in Example 1, onto a polyester film and dried in a manner such that a layer weighing 50 g/m² results.

The coated film is exposed for 15 seconds through a film original comprising groups of lines of different widths, using the exposure apparatus mentioned in Example 1.

After 120 seconds' development in a spray developing apparatus, using a 0.8 percent sodium carbonate solution, even lines of a width of only 50 μm are resolved. The developer resistance is at least 3 to 5-times the normal developing time.

The flexibility is very good, even after an exposure time of 160 seconds.

The resistance of the layer to the electroplating baths described in Example 1 is very good.

EXAMPLE 7

Example 6 is repeated, except that the 5.0 g of the urethane monomer used in the example is replaced by a mixture comprising 2.8 g of the polymerizable polyurethane used in Example 6, and
2.8 g of a polymerizable polyurethane prepared, in the manner described in Example 1, from 11 moles of 2,2,4-trimethyl-hexamethylene diisocyanate and a mixture of 5 moles of triethyleneglycol and 5 moles of 2-ethyl-2-n-butyl-propane diol-(1,3) (first reaction step) and 2 moles of hydroxy ethyl methacrylate (second reaction step).

EXAMPLE 8

Example 6 is repeated, except that the 5.0 g of the urethane monomer used in the example is replaced by 5.6 g of a urethane monomer prepared from 4 moles of 2,2,4-trimethyl-hexamethylene diisocyanate and 3 moles of triethyleneglycol (first reaction step) and 2 moles of hydroxyethyl methacrylate (second reaction step) in the manner described in Example 1.

The mixtures described in Examples 7 and 8 are used for the preparation of dry resist films in which the photopolymerizable layers have a thickness of 45 μm. The results produced are similar to those of Example 6.

EXAMPLE 9

6.5 g of the terpolymer used in Example 1, 2.8 g of the polymerizable diurethane used in Example 1, 0.1 g of 3-mercapto-propionic acid-2,4-dichloroanilide, 0.2 g of 9-phenyl-acridine, 2.8 g of the polymerizable polyurethane used in Example 6, 0.035 g of the blue dyestuff used in Example 1, and 2.8 g of the 3,5-dihydroxy-benzoic acid ester of diethyleneglycol-mono-2-ethylhexyl ether, are dissolved in 30.0 g of methyl ethyl ketone and 2.0 g of ethanol and the resulting solution is used as described in Example 1 for the preparation of a dry resist film with a layer weight of 30 g/m².

After laminating the dry resist film at 120° C. to a laminated panel provided with a copper layer, the layer is exposed for 6 seconds under the film master used in Example 6 with the aid of the exposure apparatus mentioned in Example 1. After developing the material for 45 seconds by spraying with a 0.8 percent Na₂CO₃ solution, a true copy of the lines on the master up to a width of 50 μm is obtained.

Even after an exposure time of 160 seconds, i.e. 25-times overexposure, the flexibility of the layer is still very good.

EXAMPLE 10 (COMPARATIVE EXAMPLE)

6.5 g of the terpolymer used in Example 1, 5.6 g of the polymerizable diurethane used in Example 1, 2.8 g of 4-hydroxy-(2-ethylhexyl)-benzoate, 0.1 g of 3-mercapto-propionic acid-2,4-dichloroanilide, 0.2 g of 9-phenyl-acridine, and 0.025 g of the dye "Disperse Red" (Color Index No. 179)

are dissolved in 25.0 g of methyl ethyl ketone and 2.0 g of ethanol, and the resulting solution is processed as described in Example 1 into a dry resist film with a layer weight of 52 g/m².

The resulting dry resist layer has a good light-sensitivity, but tends to become brittle by overexposure. With normal exposure time (15 seconds) the layer is flexible; after double the exposure time, i.e. 30 seconds, and increasingly with exposure times above 40 seconds, using the exposure apparatus mentioned in Example 1, the layer becomes brittle and no longer can be stretched without cracking or splintering. Moreover, the layer displays a tendency to flow at room temperature, which leads to an undesirable oozing out of the layer when the material is stored in the form of rolls of dry resist film, e.g. rolls of 50 m length. A layer of the same composition in which the diurethane is replaced by 5.0 g of the polymerizable polyurethane described in Example 6 does not show any undesirable oozing out of the layer of resist rolls during storage, a fact which can be attributed to the considerably lower cold flow. This layer maintains its flexibility even after 10-times overexposure.

The following Tables show the viscosities of known polymerizable urethanes and of compounds according to the invention, once in an 80 percent solution in toluene (Table A) and once in a solvent-free state (Table B). With increasing viscosity, the cold flow of the layers in which the monomers mentioned are contained in the mixture described in Example 10 becomes correspondingly less pronounced.

TABLE A

| Composition of the Monomer (starting materials in moles) | | | Average Molecular Weight (calculated from the moles used) | Viscosity in Toluene 80% by weight at 23° C. mPa . s |
|---|---|---|---|---|
| TMDI[1] | Triethylene glycol | HEMA[2] | | |
| *2 | 1 | 2 | 830 | 1410 |
| 3 | 2 | 2 | 1190 | 3900 |
| 4 | 3 | 2 | 1550 | 8930 |
| 5 | 4 | 2 | 1910 | 12750 |
| 7 | 6 | 2 | 2630 | 13400 |

[1]TMDI = 2,2,4-Trimethyl-hexamethylene diisocyanate
[2]HEMA = Hydroxyethylmethacrylate
*German Offenlegungsschrift No. 2,361,041

TABLE B

| Monomer or Monomer Mixture | Viscosity at 23° C., mPa . s |
|---|---|
| Diurethane according to Example 1 (according to German Offenlegungsschrift No. 2,064,079) 1 TMDI + 2 HEMA | 10,700 |
| Tetraurethane according to German Offenlegungsschrift No. 2,361,041 2 TMDI + 1 triethylene glycol + 2 HEMA | 183,400 |
| Mixture of: 50% of tetraurethane according to German Offenlegungsschrift No. 2,361,041, and 50% of polyurethane obtained from 4 TMDI + 3 triethyleneglycol + 2 HEMA | 802,300 |
| Mixture of: 50% of diurethane according to Example 1 50% of polyurethane obtained from 11 TMDI + 10 triethyleneglycol + 2 HEMA | 3,772,000 |

The cold flow of layers containing these monomers decreases in accordance with the increase of the viscosity.

With increasing viscosity of the monomers used the flexibility of the exposed or overexposed layers increases. The adhesion of the exposed layers to copper and their resistance to developer solutions and electroplating baths remains substantially the same.

EXAMPLE 11 (COMPARATIVE EXAMPLE)

If in the mixture described in Example 10 the polymerizable diurethane mentioned is replaced by the same quantity (5.6 g) of a tetraurethane prepared from 2 moles of 2,2,4-trimethyl-hexamethylene diisocyanate and 1 mole of polyethylene glycol with an average molecular weight of 400 (first reaction step) and 2 moles of hydroxy ethyl methacrylate (second reaction step), and the mixture is processed in the manner described in Example 1 to produce a dry resist film with a layer weight of 52 g/m², the further process described in Example 1 yields a resist mask which has the drawback that in a copper bath copper is deposited only at a distance of about 50 μm from the edges of the resist mask. This means that in the case of circuit paths of less than 100 μm width, e.g., no copper at all is deposited.

It will be obvious to those skilled in the art that many modifications may be made within the scope of the present invention without departing from the spirit thereof, and the invention includes all such modifications.

What is claimed is:

1. A light-sensitive transfer material, comprising a flexible temporary support and a thermoplastic photopolymerizable layer which layer comprises a polymeric, thermoplastic binder which is soluble or at least swellable in aqueous-alkaline solutions, a polyurethane with two terminal acrylic acid or methacrylic acid ester groups which is capable of addition polymerization, and a photoinitiator, said polyurethane corresponding to Formula I $$CH_2=C-COO-Z-CONH-Y-$$
$$\quad\quad |$$
$$\quad\quad R_1$$

$$-(NHCOO-X-CONH-Y-)_n NHCOO-Z-CO-C=CH_2$$
$$\quad\quad\quad\quad\quad\quad\quad\quad\quad\quad\quad\quad\quad\quad\quad\quad\quad\quad |$$
$$\quad\quad\quad\quad\quad\quad\quad\quad\quad\quad\quad\quad\quad\quad\quad\quad\quad\quad R_1$$

wherein
—X— is one of the groups

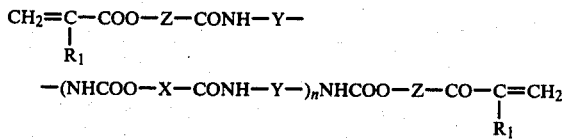

—$C_kH_{2k}$—O— and
—$C_rH_{2r-2}$—O—

Y is a saturated aliphatic or cycloaliphatic group with 2 to 12 carbon atoms, and
Z is

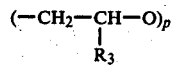

and wherein $R_1$, $R_2$, and $R_3$ are hydrogen atoms or methyl groups,
n is a whole number from 2 to 15,
m is a whole number from 2 to 4,
p is a whole number from 1 to 4,
k is a whole number from 2 to 12, and
r is a whole number from 4 to 12.

2. A light-sensitive transfer material according to claim 1 including a peelable cover film on the surface of the layer remote from the support.

3. A light-sensitive transfer material according to claim 1 in which in the compound corresponding to Formula I, n is a whole number from 2 to 11.

4. A light-sensitive transfer material according to claim 1 in which in the compound corresponding to Formula I, $R_1$ is a methyl group.

5. A light-sensitive transfer material according to claim 1 in which in the compound corresponding to Formula I, X is the group

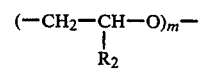

6. A light-sensitive transfer material according to claim 1 in which in the compound corresponding to Formula I, $R_2$ is a hydrogen atom.

7. A light-sensitive transfer material according to claim 1 in which in the compound corresponding to Formula I, m=3 and $R_2$ is a hydrogen atom.

8. A light-sensitive transfer material according to claim 1 in which in the compound corresponding to Formula I, $R_3$ is a hydrogen atom and p=1.

9. A light-sensitive transfer material according to claim 1 in which in the compound corresponding to Formula I, Y is a saturated aliphatic group with at least one lateral methyl group.

10. A light-sensitive transfer material according to claim 1 which contains from 10 to 60 percent by weight, calculated on its non-volatile components, of compounds corresponding to Formula I.

11. A light-sensitive transfer material according to claim 1 in which the binder is an acrylic acid or methacrylic acid copolymer with an acid number between 50 and 250.

12. A light-sensitive transfer material according to claim 1 in which the copolymer is a terpolymer obtained from methacrylic acid, an alkyl methacrylate with 4 to 15 carbon atoms in the alkyl group, and a further monomer which can be copolymerized with the first two components and whose homopolymer has a glass transition temperature of at least 80° C.

* * * * *